(12) United States Patent
Fujimoto

(10) Patent No.: US 6,841,890 B2
(45) Date of Patent: Jan. 11, 2005

(54) WAFER ALIGNMENT MARK FOR IMAGE PROCESSING INCLUDING RECTANGULAR PATTERNS, IMAGE PROCESSING ALIGNMENT METHOD AND METHOD OF MANUFACTURING SEMICONDUCTOR DEVICE

(75) Inventor: Masashi Fujimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/408,349

(22) Filed: Apr. 8, 2003

(65) Prior Publication Data

US 2003/0199131 A1 Oct. 23, 2003

(30) Foreign Application Priority Data

Apr. 12, 2002 (JP) ........................... 2002-110091

(51) Int. Cl.⁷ ............................................. H01L 23/544
(52) U.S. Cl. ...................... 257/797; 438/401; 438/462
(58) Field of Search ................... 438/401, 462; 257/797

(56) References Cited

U.S. PATENT DOCUMENTS 6,677,088 B2 * 1/2004 Magome et al. ............... 430/5

FOREIGN PATENT DOCUMENTS

| JP | 57-026434 | 2/1982 |
| JP | 62-205623 | 9/1987 |
| JP | 9-74063 | 3/1997 |
| JP | 10-319574 | 12/1998 |

* cited by examiner

*Primary Examiner*—Dung A. Le
(74) *Attorney, Agent, or Firm*—McGinn & Gibb, PLLC

(57) ABSTRACT

An alignment mark is arranged to be within an image screen and the alignment mark is formed with rectangular patterns having varied dimensions from each other. The signal waveforms from each of the rectangular patterns are measured. The number of the rectangular patterns with normal waveforms is compared to the minimum required number of marks prescribed beforehand. The amount of deviation in alignment is calculated by excluding the abnormal measured result.

19 Claims, 8 Drawing Sheets

| | |
|---|---|
| Number of Rectangular Patterns | 6 |
| Minimum Required Number | 2 |

| Rectangular Pattern No. | X-coordinate in Center ($\mu$m) | Y-coordinate in Center ($\mu$m) | Pattern Size in X-direction ($\mu$m) | Pattern Size in Y-direction ($\mu$m) |
|---|---|---|---|---|
| 1 | -9000 | -9000 | 5 | 5 |
| 2 | -8990 | -9000 | 5 | 5 |
| 3 | -8980 | -9000 | 5 | 5 |
| 4 | -9000 | -8980 | 5 | 5 |
| 5 | -8990 | -8980 | 5 | 5 |
| 6 | -8980 | -8980 | 5 | 5 |

FIG.9(a)  FIG.9(b)  FIG.9(c)
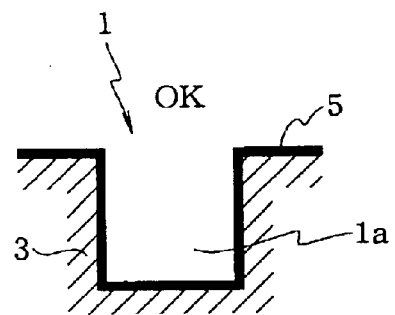 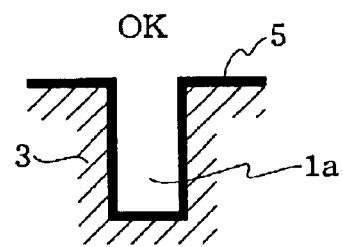 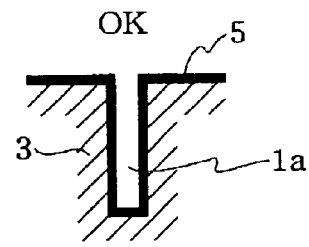
FIG.10(a)  FIG.10(b)  FIG.10(c)
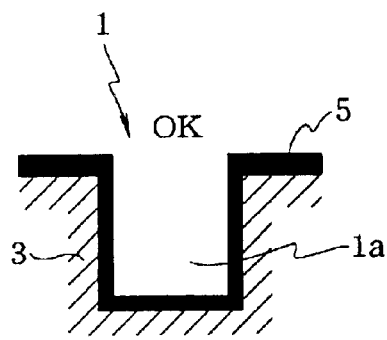 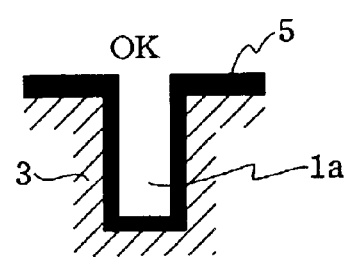 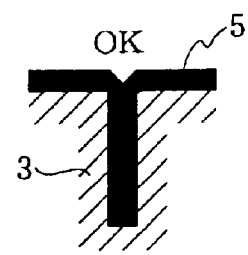

US 6,841,890 B2

WAFER ALIGNMENT MARK FOR IMAGE PROCESSING INCLUDING RECTANGULAR PATTERNS, IMAGE PROCESSING ALIGNMENT METHOD AND METHOD OF MANUFACTURING SEMICONDUCTOR DEVICE

BACKGROUND OF THE INVENTION

1. Field of the Invention

The present invention relates to a wafer alignment mark for image processing, an image processing alignment method using the wafer alignment, and a method of manufacturing a semiconductor device.

2. Description of the Related Art

Conventionally, as shown in FIG. 12, wafer alignment marks 1 and 1 for achieving fine alignment in X- and Y-directions are disposed in scribe regions in the X- and Y-directions of each shot 2 provided on a wafer 3.

Typically, used as the wafer alignment mark 1 for the image processing is a box-type pattern with 6 μm in lateral dimension and 30 μm in longitudinal dimension in its external shape or an L/S mark of frame-type pattern, in which a plurality of lines (about seven to nine) are provided at about 6 μm intervals.

If the wafer alignment mark 1 for image processing is formed to have the originally designed dimensions, the alignment accuracy can be maintained.

However, in general, there is often a gap between the shape or dimension of the wafer alignment mark 1, which has gone through various semiconductor manufacturing processes, and the designed values of the device. Therefore, there may face problems such as errors in alignment measurement due to deformation, asymmetry, variations in the processes and the like.

In order to suppress the problem such as the error in the alignment measurement to a minimum, it is desirable to provide a plurality of wafer alignment marks 1 by every process.

However, in general, there are twenty or more steps in lithography and, at the same time, there is a limit for the area used as scribe regions. Therefore, it has been extremely difficult to provide a plurality of wafer alignment marks corresponding to all the process.

SUMMARY OF THE INVENTION

An object of the present invention is to provide a wafer alignment mark for image processing, an image processing alignment method and a method of manufacturing a semiconductor device, which can supress deterioration in the alignment accuracy caused through the process without increasing the area to be occupied by the wafer alignment marks, while enabling to improve the overlapping accuracy and to improve the throughput.

In order to achieve the foregoing objects, the alignment mark for image processing according to the present invention has a structure which comprises a wafer alignment mark and a plurality of rectangular patterns provided in the wafer alignment mark. The wafer alignment mark is disposed near a peripheral edge within a range of a shot to be picked up, and the rectangular patterns are a plurality of the rectangular patterns formed smaller than the wafer alignment mark while being in different dimensions from each other.

In the present invention, signals for performing alignment are obtained by scanning a plurality of the rectangular patterns thereby to perform alignment using the signal data.

Thus, even though there is a problem generated in a part of the rectangular patterns through various semiconductor manufacturing processes, it is possible to measure signal waveforms by using the rest of the rectangular patterns. Thereby, alignment can be surely performed. Further, a plurality of rectangular patterns are provided in one wafer alignment mark so that the wafer alignment mark can be disposed within a minimum required area in the wafer. Therefore, even if there are a plurality of lithography steps, there is no need to increase the number of wafer alignment marks so that the region on the wafer for forming elements are not to be disturbed.

It is desirable that the wafer alignment mark be disposed in a scribe region provided in the peripheral edge of one shot. Also, the wafer alignment mark may be disposed at least in one axial direction out of two axial directions crossing at right angles in the shot.

Further, the rectangular patterns may be formed with frame-type patterns composed of a plurality of lines in a frame form. In this case, the rectangular patterns maybe preferably formed with varied width of lines which form the frame-type patterns or formed with varied ratio of the width and length of lines which form the frame-type patterns.

When providing the rectangular patterns in the wafer alignment mark, the rectangular patterns may be formed of frame-type patterns with different ratio of the line lengths, and the rectangular patterns may be disposed in the shot by varying the facing directions of the frame-type patterns.

Further, the rectangular patterns may be formed with box-type patterns having rectangular external shapes. In this case, it is desirable that the rectangular patterns be formed with varied length of sides which form the external shape of the box-type patterns so as to be in similar shapes.

Also, when providing the rectangular patterns in the wafer alignment mark, the rectangular patterns may be arranged in accordance with the order of the ratio of change in dimensions or may be arranged at random regardless of the ratio of change in the dimensions.

An image processing alignment method according to the present invention has a structure, which comprises the steps of: a first step of picking up, in a shot, a wafer alignment mark with a plurality of rectangular patterns having different dimensions from each other; and a second step of scanning a plurality of the rectangular patterns in the picked up wafer alignment mark.

In the present invention, a wafer alignment mark with a plurality of rectangular patterns having different dimensions from each other is picked up in one shot and the rectangular patterns in the picked up wafer alignment mark are scanned.

Thus, even though there is a problem generated in a part of the rectangular patterns through various semiconductor manufacturing processes, it is possible to measure signal waveforms by using the rest of the rectangular patterns.

Further, the method may comprise the steps of: a third step of measuring signal waveforms from the rectangular patterns by every rectangular pattern through scanning a plurality of the rectangular patterns; a fourth step of judging normality/abnormality of the rectangular patterns through comparing, with a prescribed standard value, the signal waveforms obtained in the third step; and a fifth step of calculating the amount of positional deviation in alignment by excluding the measured result of the rectangular pattern which is judged to be abnormal in the fourth step.

Also, the method may further comprise the steps of: a sixth step of judging normality/abnormality of measurement of the rectangular patterns through comparing, with a prescribed value, the number of rectangular patterns with normal signal waveforms obtained by scanning the rectangular patterns; and a seventh step of calculating amount of positional deviation in alignment by excluding measured result of the rectangular pattern which is judged to be abnormal in the sixth step.

Furthermore, the method may comprise the step of: an eighth step of processing the mean value of the amount of positional deviation in the alignment as the amount of positional deviation in the rectangular patterns or the shot.

Moreover, the image processing alignment method according to the present invention, which comprises a first step of picking up, in a shot, a wafer alignment mark with a plurality of rectangular patterns having different dimensions from each other and a second step of scanning a plurality of the rectangular patterns in the picked up wafer alignment mark, can be executed in lithography in a method of manufacturing a semiconductor device.

As described, with the present invention using wafer alignment mark which comprises a plurality of rectangular patterns having different dimensions from each other, the amount of positional deviation in alignment can be calculated through measuring the signal waveforms from the rectangular patterns thereby to compare the value with the standard value. Therefore, deterioration in the alignment accuracy caused through the process can be suppressed and the overlapping accuracy can be remarkably improved without increasing the area to be occupied by the wafer alignment mark.

Further, by employing such image processing alignment method in a semiconductor process, it becomes possible to improve the throughput in the steps of manufacturing semiconductor devices and the like.

BRIEF DESCRIPTION OF THE DRAWINGS

FIG. 9 is an illustration showing the effect of the present invention in the case of excellent detection;

FIG. 10 is an illustration showing the effect of the present invention in the case of the alignment measurement error and a problem;

DETAILED DESCRIPTION OF THE PREFERRED EMBODIMENTS

In the followings, the present invention will be described in detail by referring to the accompanying drawings.

In a wafer alignment mark for image processing according to preferred embodiments of the present invention, a wafer alignment mark 1 comprises a plurality of rectangular patterns 1a (frame-type patterns or box-type patterns) having different dimensions from each other. Therefore, even if there is a problem generated in any one of the rectangular patterns after going through various semiconductor manufacturing processes, it is possible to calculate the amount of deviation in the alignment through using other rectangular patterns. Thereby, the overlapping accuracy can be remarkably improved and the throughput in the manufacturing step of the semiconductor device and the like can be improved.

The above-described embodiments of the present invention will be described by referring to the accompanying drawings in order to be described further in detail.

First Embodiment

First, a wafer alignment mark for image processing, an image processing alignment method and a method of manufacturing a semiconductor device according to a first embodiment of the present invention will be described by referring to FIG. 1 to FIG. 7, and FIG. 7 to FIG. 11.

As described, after going thorough various processes of manufacturing semiconductor, there are often errors or deviations generated in the shape and dimension of the wafer alignment mark with respect to the designed values of the device. Thus, there may cause problems such as errors in measuring alignment due to deformation, asymmetry, variations in the processes and the like.

In order to improve the overlapping accuracy of the wafer alignment mark for image processing, the wafer alignment mark 1 for image processing according to the embodiment, as shown in FIG. 1, comprises a wafer alignment mark 1 and a plurality of rectangular patterns 1a provided within the wafer alignment mark 1. The wafer alignment mark 1 is disposed near the peripheral edge within the range of one shot 2 to be picked up. The rectangular patterns 1a are a plurality of rectangular patterns formed to have a smaller dimension than the wafer alignment mark 1 while being in different dimensions from each other.

Figure 12:
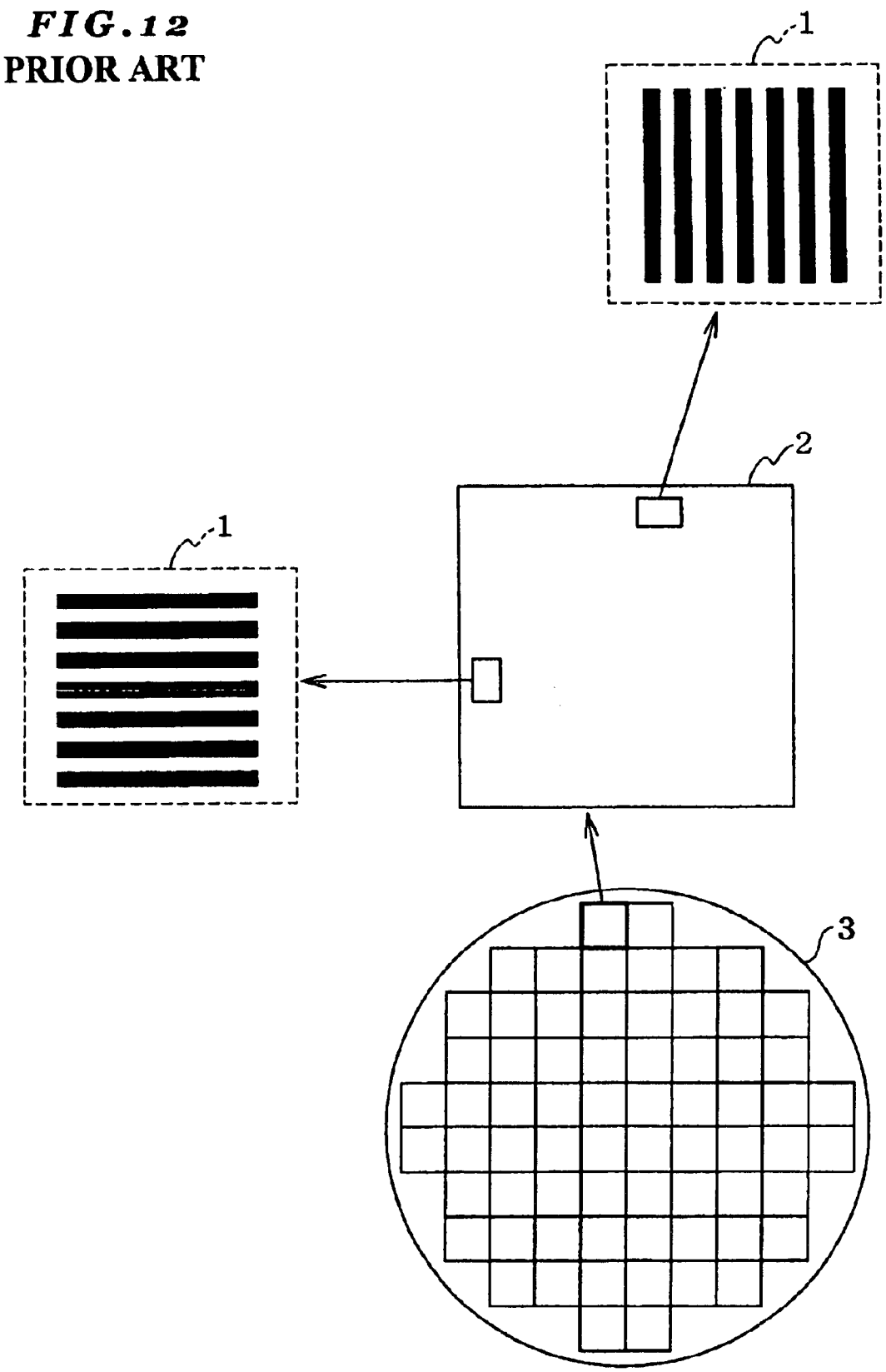
FIG. 12 is a plan view showing a wafer alignment mark of the related art.

The wafer alignment mark 1 of the present invention has substantially the same external dimension as the conventional wafer alignment mark 1 shown in FIG. 12, and comprises a plurality of the rectangular patterns 1a within the external dimension.

A plurality of the rectangular patterns 1a are frame-type patterns composed of four lines L1, L2, L3, and L4 forming a square or rectangle, or box-type patterns in a square or rectangular external shape. In this case, the rectangular patterns 1a may be formed in similar shapes with varied width of the lines L1, L2, L3, and L4, which form the frame-type patterns. Also, the rectangular patterns 1a may be formed to have different ratio of the width and length of the lines forming the frame-type patterns. Further, the rectangular patterns 1a may be formed to be frame-type patterns with different ratio of length of the lines to be disposed within one shot by varying the facing directions of the frame-type patterns (for example, FIG. 2).

Also, it is desirable to vary the lengths of the sides forming the external shapes of the box-type patterns to be the rectangular patterns 1a. The rectangular patterns 1a may be arranged in order according to the ratio of change in dimensions or may be arranged at random regardless of the ratio of change in the dimensions.

Figure 1A:
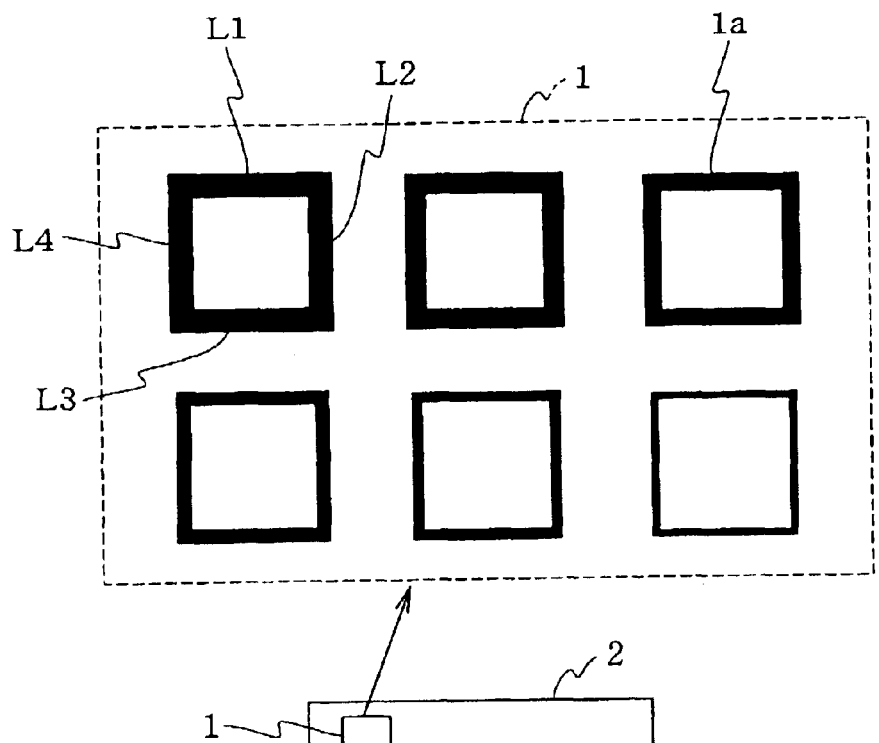
FIG. 1 is a plan view showing the structure of a wafer alignment mark (frame-type pattern) according to a first embodiment of the present invention.
Figure 2:
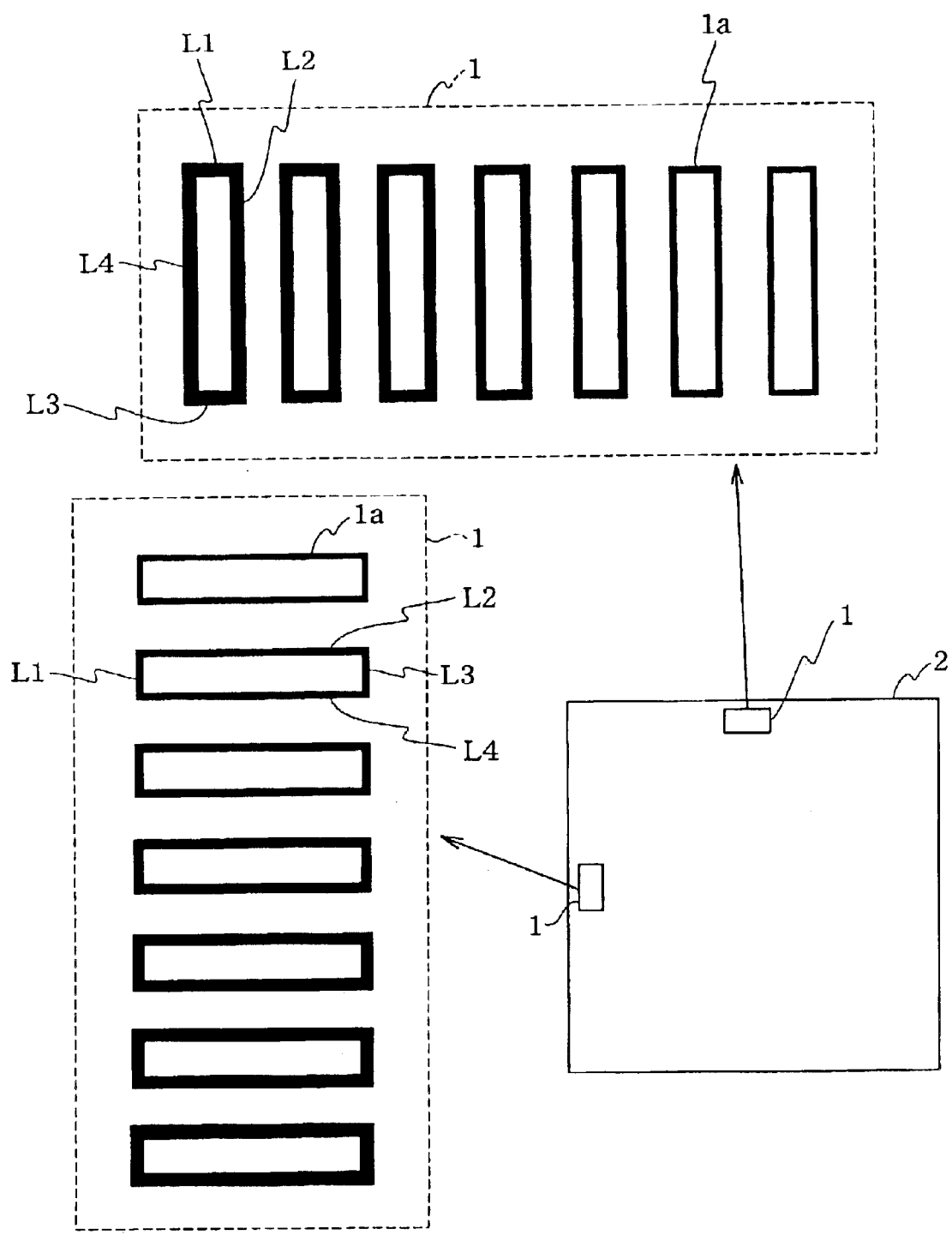
FIG. 2 is a plan view showing another structure of a wafer alignment mark (frame-type pattern) according to a first embodiment of the present invention.
Figure 3:
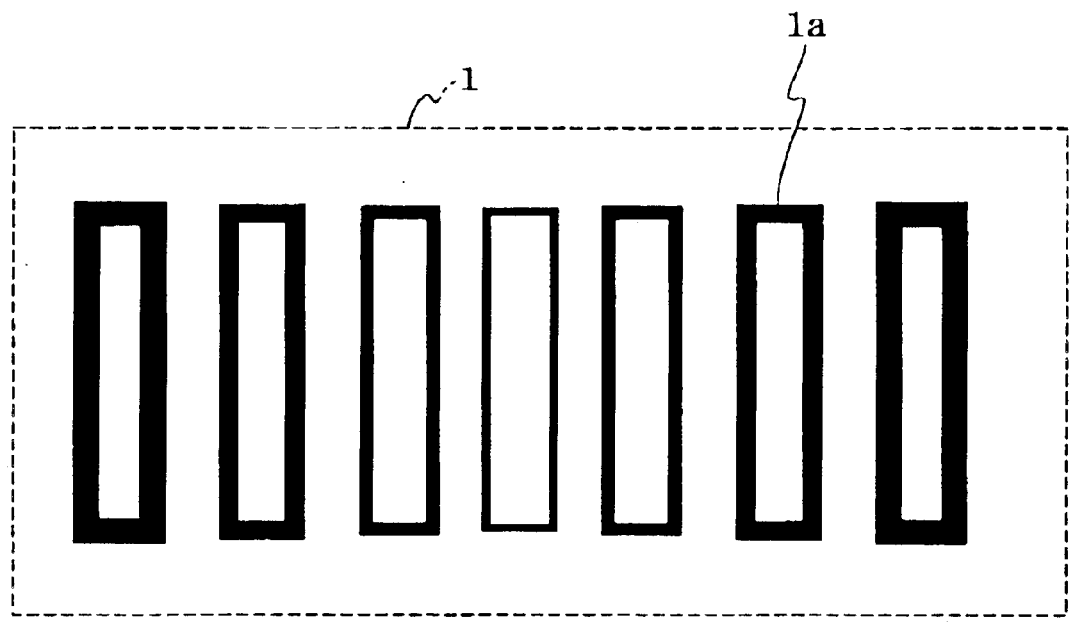
FIG. 3 is a plan view showing still another structure of a wafer alignment mark (frame-type pattern) according to a first embodiment of the present invention.

In the frame-type patterns (rectangular patterns 1a) shown in FIG. 1(a), FIG. 2(a) and FIG. 3, the areas surrounded by the four lines L1, L2, L3, and L4 are punched and an alignment processing is performed using the four lines L1, L2, L3, and L4. In FIG. 1(a), FIG. 2(a) and FIG. 3, the four lines L1, L2, L3, and L4 contributing to alignment are blacked out so as to be distinguished from other areas.

Figure 4:
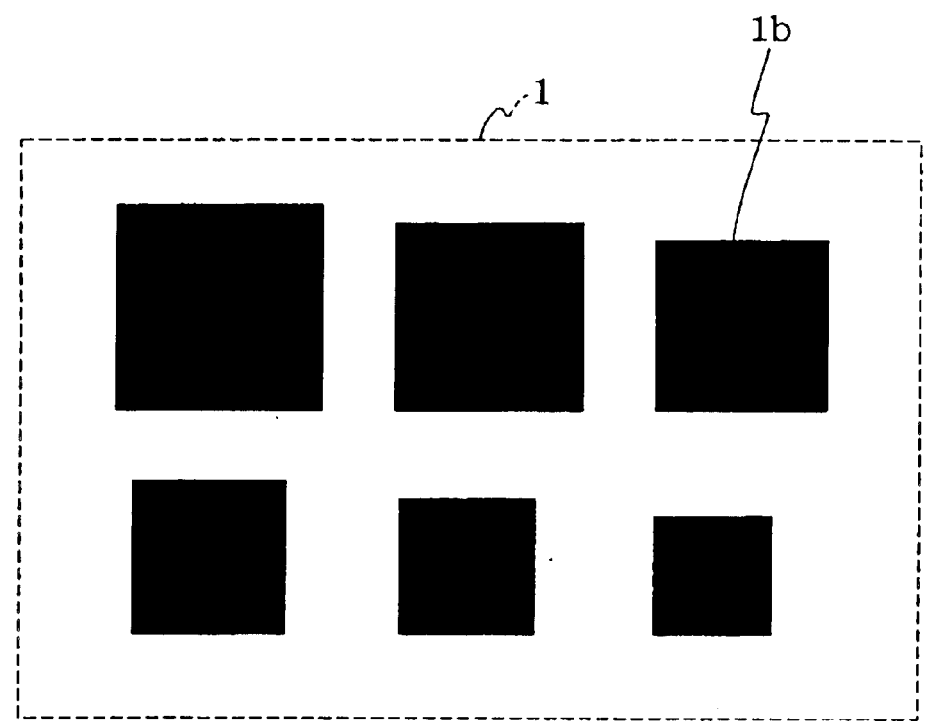
FIG. 4 is a plan view showing the structure of a wafer alignment mark (box-type pattern) according to a second embodiment of the present invention.
Figure 5:
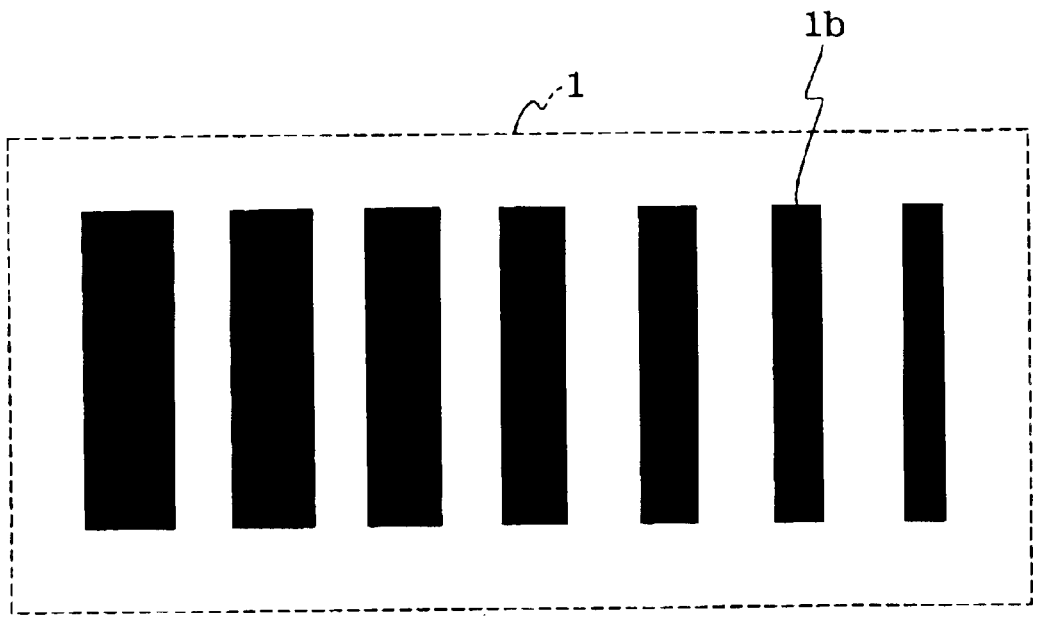
FIG. 5 is a plan view showing another structure of a wafer alignment mark (box-type pattern) according to a second embodiment of the present invention.
Figure 6:
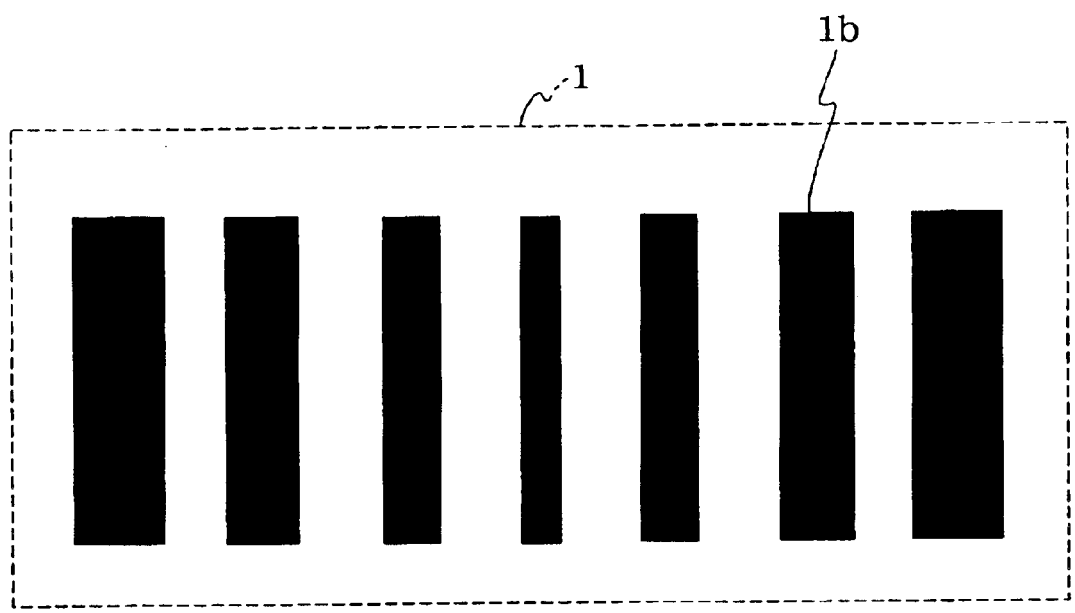
FIG. 6 is a plan view showing still another structure of a wafer alignment mark (box-type pattern) according to a second embodiment of the present invention.

As for the box-type patterns (rectangular patterns 1b) shown in FIG. 4, FIG. 5 and FIG. 6, external shapes of the patterns themselves are formed in squares or rectangles and the alignment processing is performed using the squares or the rectangles. In FIG. 4, FIG. 5 and FIG. 6, the squares or the rectangles contributing to alignment are blacked out so as to be distinguished from other areas.

Figure 1B:
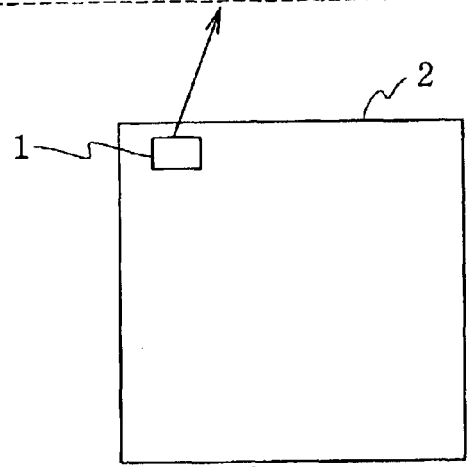
Figure 1C:
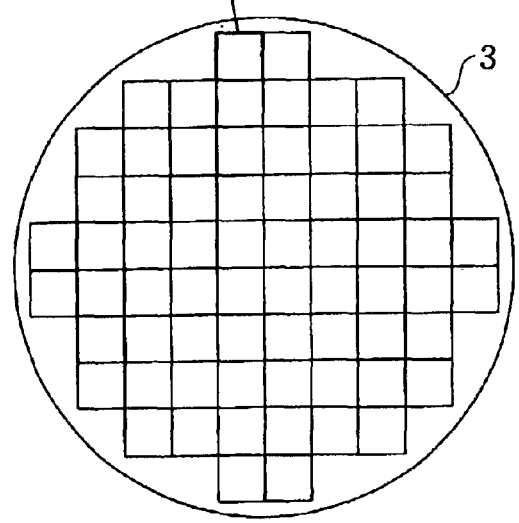

Specifically, the wafer alignment mark 1 for image processing according to the present invention is formed in a scribe region of each shot 2 shown in FIG. 1B which is one of shot maps on a wafer 3 shown in FIG. 1(c).

As described, the wafer alignment mark 1, as shown in FIG. 1A, comprises a plurality of frame-type patterns 1a having different dimensions with varied widths of the lines L1, L2, L3, L4, and the external dimension of the wafer alignment mark 1 is set to be substantially the same as that of the conventional L/S wafer alignment mark for image processing.

Usually, the widths of the lines L1, L2, L3, and L4 forming the frame-type patterns 1a are set to be about 0.2 μm to 2 μm. In the frame-type patterns 1a shown in FIG. 1, a plurality of the rectangular patterns are formed through varying the widths of the lines L1, L2, L3, and L4, in 0.2, 0.4, 0.6, 0.8, 1.0, 1.2 μm.

The shorter the length of side of the frame-type pattern 1a, the smaller the area occupied by the wafer alignment mark 1 in one shot 2. However, if the length of side of the frame-type pattern 1a is too short, the measurement accuracy is deteriorated in regards to resolution of optical systems for alignment.

Taking this into consideration, the length of one side of the external dimension of the frame-type pattern 1a is set to be about 1 μm to 30 μm. Also, in FIG. 1, the square-shaped rectangular patterns 1a with 5 μm sides are arranged in two lines (totaling six patterns) within the wafer alignment mark 1.

The shape of the rectangular patterns 1 is not limited to a square as shown in FIG. 1(a) but may be formed in an oblong rectangle as shown in FIG. 2. In this case, the widths of the lines L1, L2, L3, and L4, forming the oblong rectangular patterns 1a, are set to be about 1 μm to 30 μm as in the case described above.

When performing the alignment processing, basically, in order to improve the throughput, alignments in X-direction and Y-direction are simultaneously performed using the wafer alignment mark 1.

When there is a space in the scribe region of one shot 2, as shown in FIG. 2, the wafer alignment 1 may be disposed in each of the scribe regions in the X-direction (lateral direction in the figure) and the scribe region in the Y-direction (longitudinal direction in the figure) in one shot 2, and each wafer alignment mark 1 may comprise a plurality of rectangular patterns 1a therein. In this case, it is desirable that the rectangular patterns 1a provided in the wafer alignment mark 1 in the X-direction be in rectangular shapes with longer longitudinal sides (longitudinal direction in the figure), the rectangular patterns 1a provided in the wafer alignment mark 1 in the Y-direction be in rectangular shapes with longer lateral sides (in the lateral direction in the figure), and these shapes each are arranged in a line in the X-direction and Y-direction.

It becomes thus possible to improve the throughput through simultaneously performing the alignments in the X-direction and Y-direction by using the rectangular patterns 1a in the X- and Y-directions.

Further, in FIG. 1 and FIG. 2, the widths of the lines L1, L2, L3, and L4 are varied in order from the wider width to narrower width or, inversely, from the narrower width to wider width. However, it is not limited to these. As shown in FIG. 3, the widths of the lines L1, L2, L3, and L4 of the rectangular patterns 1a positioned in both ends may be set to be the widest and to narrow the widths of the lines in order towards the center area. Further, although not shown in Figure, the widths of the lines L1, L2, L3, and L4 may be varied at random.

Figures 7, 8:
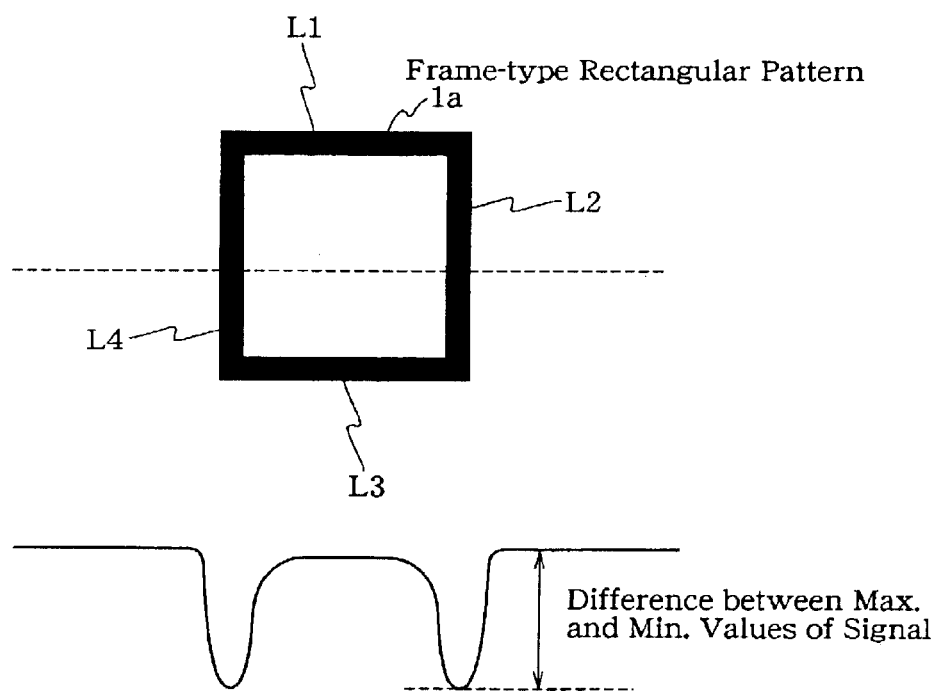
FIG. 7 is a table showing parameter inputted to an exposure device.
FIG. 8 is a model illustration of a signal waveform of the wafer alignment mark according to the first embodiment of the present invention.

For alignment exposure, parameters as shown in FIG. 7 are inputted to an exposure device. Typical parameters are the number of rectangular patterns 1a provided in a pair of wafer alignment marks 1, the minimum number of the rectangular patterns 1a required to calculate the amount of positional deviation, X, Y coordinates of each rectangular pattern 1a, pattern size and the like. In general, these parameters are recorded together in a job fie for setting shot maps, amount of exposure, focus offset and the like.

Next, an image processing alignment method according to the embodiment will be described by referring to a flowchart shown in FIG. 11. First, the wafer 3 is loaded to a wafer stage of the an exposure device. After loading deviation is corrected by rough alignment, fine alignment is performed.

Then, in step S101, the wafer alignment mark 1 as shown in FIG. 1(a) is picked up by a CCD camera through an alignment microscope.

Then, mark number N is set to 1 in step S102, and signal processing of a first rectangular pattern 1a is performed in step S103. Specifically, when scanning the rectangular pattern 1a in the X-direction (lateral direction in the figure) as shown by a dotted line in FIG. 8A, a signal waveform as shown in FIG. 8B is outputted. In short, as shown in FIG. 8B, the signal value is the minimum when scanning the lines L4 and L2 in the longitudinal direction and the signal value becomes the maximum when scanning the areas outside the two lines L4 and L2, and the punched areas in between the two lines L4 and L2.

Then, in step S104, signal intensity and the standard value are compared based on the signal waveform shown in FIG. 8B, which is obtained by scanning.

In step S105, the measurement is judged to be normal when the difference (shown by an arrow in FIG. 8B) between the maximum value and the minimum value of the signal is larger than the standard value. Then, the amount of positional deviation is calculated based on the minimum value of the signal and the midpoint of slice level, so as to store it in a storage/arithmetic unit.

In step S106, the measurement is judged to be abnormal when the difference between the maximum value and the minimum value of the signal is smaller than the standard value, and the data is cancelled without performing data processing. The above-described processing is performed in the Y-direction as well. Normality/abnormality of measurement may be determined separately in the X- and Y-directions, or it may be judged as normal only when the measurements in both X- and Y-directions are normal.

Further, in step S107, data on the state of processing in step S105 is obtained so as to determine whether or not the processing performed in step S105 is for the rectangular pattern 1a of the last mark number. If it is not, it is so transmitted to step S108 that the processing is not performed on the rectangular pattern 1a of the last mark number.

In step S108, upon receiving the results of the processing performed in step S106 and the processing in step S107, a command is transmitted to the processing in step S103 to perform scanning on the rectangular pattern of N+1 (1 is added to the mark number N).

According to the command, the processing in step S104, step S105, step S106 and step S107 is continuously performed until the rectangular pattern 1a of the last mark number.

Subsequently, in step S109, the number of patterns judged as normal and the minimum required number of patterns are compared. If the number of patterns judged as normal has reached the standard, the mean value of the all measurements is calculated in step S110 so as to be stored in the storage/arithmetic unit as the amount of positional deviation in the shot. Then, next alignment shot set in the job file is to be started. The mean value is employed here since there are random dispersions in any of the measurement results due to noise and the like. By averaging the results, random dispersions are balanced so that the measurement accuracy can be improved.

When the number of patterns judged as normal in step S109 is less than the minimum required number of patterns, all the measurements of the shot is judged as abnormal so that it is not used for data processing. Then, next alignment shot is to be started (step S111).

Figure 11:
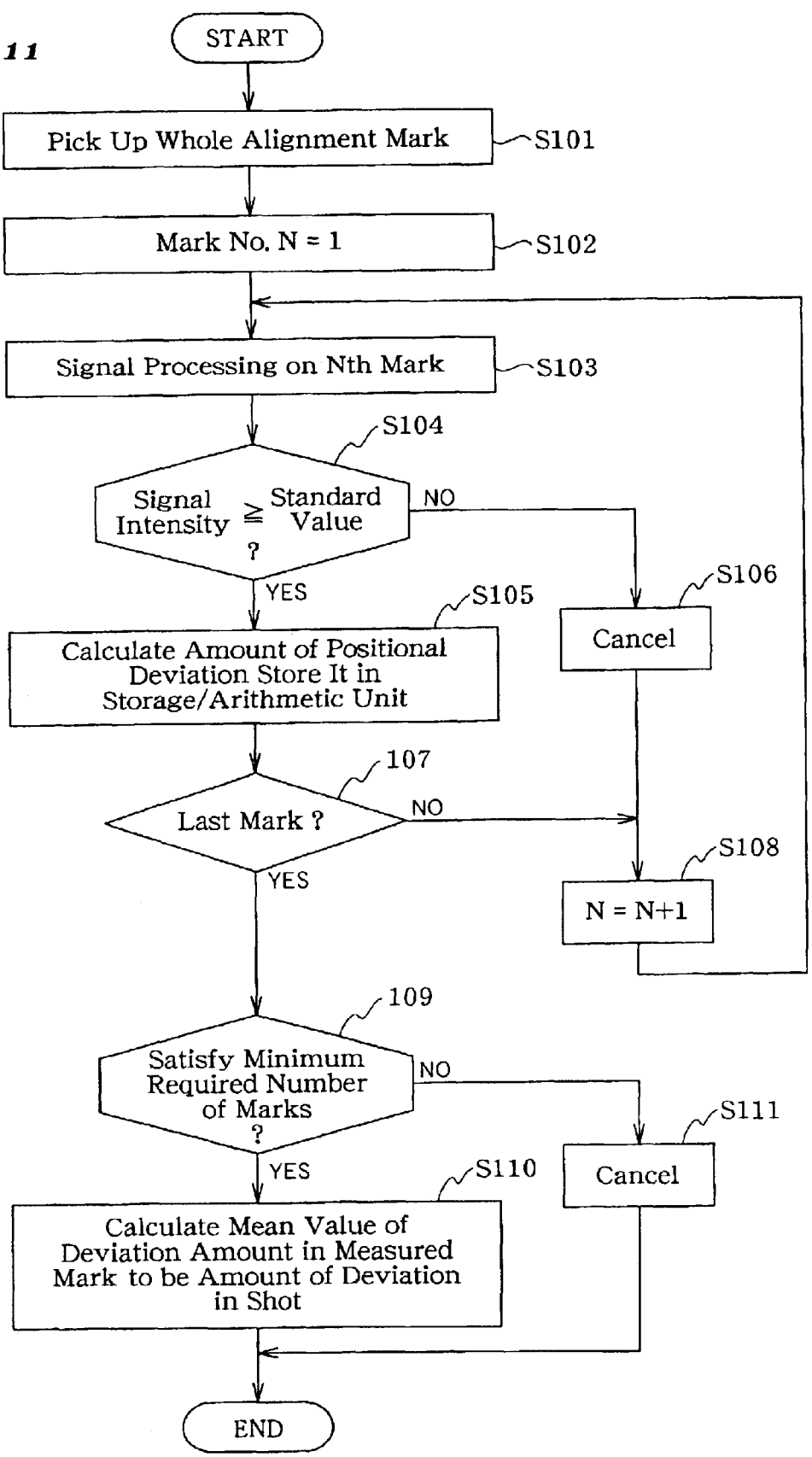
FIG. 11 is a flowchart showing the order of an image processing alignment method according to the first embodiment of the present invention.

All the processing shown in FIG. 11 is an electric signal processing so that it does not include stage drive and the like. Therefore, practically, the processing from picking up image to the end (right before starting the next shot) is instantly performed.

When the measurements of all the alignment shots are completed, offset (translation error), scaling (expansion/contraction error), rotation (rotation error) and the like are calculated by performing statistical processing on the amount of positional deviation in each alignment shot by least squares and the like. Then, exposure is performed through correcting the shot map based on the result.

As described, in the wafer alignment mark for image processing and the image processing alignment method according to the embodiment, a plurality of rectangular patterns 1a with different frame widths or dimensions, more specifically, with different width of the lines forming the frames or different external dimensions, are provided in the wafer alignment mark 1. Therefore, even when a part of the rectangular patterns 1a is deformed through various semiconductor manufacturing processes, the signal waveform can be measured by using other rectangular patterns 1a with different dimensions. Thus, alignment can be surely performed through comparing the number of measurable rectangular patterns 1a and the prescribed minimum required number of patterns, and calculating the amount of positional deviation in the alignment by excluding the measured results of the patterns and shots judged as abnormal.

The rectangular patterns 1a shown in FIG. 9 and FIG. 10 are formed by lines (L1, L2, L3, L4) with, for example, varied widths having a concave structure (or convex structure). In the process, a sputter film 5 is formed on the wafer alignment 1. The sputter film 5 shown in figure is blacked out. As shown in FIGS. 9A, 9B, and 9C, when the sputter film 5 is thin, an excellent signal waveform can be obtained from any frame-type patterns 1a with different widths, either large or small. As shown in FIG. 10, when the sputter film 5 becomes thick, there may be cases that the frame-type patterns 1a with narrow width are completely buried with the sputter film 5.

In such a case, alignment error may be generated when there is only one type of pattern as the case of the related art. However, with the present invention in which a plurality of frame-type patterns 1a with varied line widths are provided in one wafer alignment mark 1, the probability of generating alignment problems can be remarkably decreased.

Second Embodiment

Next, a wafer alignment mark for image processing, an image processing alignment method and a method of manufacturing a semiconductor device according to a second embodiment of the present invention will be described by referring to FIG. 4 to FIG. 6. FIG. 4 is a plan view showing the structure of an alignment mark according to the second embodiment, and FIG. 5 and FIG. 6 are plan views showing the variations.

The line widths of the frame-type patterns 1a forming the alignment mark 1 are varied in the first embodiment, however, as shown in FIG. 4, FIG. 5 and FIG. 6, the alignment mark 1 in the second embodiment comprises box-type patterns 1b having a rectangular external shape in which the dimensions are varied by changing the length of sides forming the external shape of the box-type rectangular patterns. In this case, although the effects and dependability becomes a little smaller, substantially the same effects as those in the first embodiment can be achieved. The reason is that when the dimensions of the box-type patterns 1b change, the film thickness deposited on the edge shape or inside the mark changes so that the signal waveform also changes.

As described, with the wafer alignment mark for image processing, the image processing alignment method and the method of manufacturing a semiconductor device of the present invention, it is possible to suppress deterioration in the alignment accuracy caused during the processes and to remarkably improve the overlapping accuracy without increasing the area occupied by the alignment mark. Also, the area for the alignment mark within a shot can be reduced and the throughput can be improved.

This can be achieved since the wafer alignment mark for image processing of the present invention is formed to comprise a plurality of frame-type patterns or box-type patterns with different dimensions. Therefore, even if there is a problem generated in a part of rectangular patterns through various semiconductor manufacturing processes, the signal waveform can be measured using the rest of the rectangular patterns. Thus, the amount of positional deviation in alignment can be calculated by excluding the measured results which are judged as abnormal by comparing the number of measurable patterns with the prescribed minimum required number of patterns, so that the alignment can be surely performed.

What is claimed is:

1. A wafer alignment mark for image processing, comprising:
   a plurality of rectangular patterns provided in the wafer alignment mark,
   wherein the wafer alignment mark is disposed near a peripheral edge within a range of a shot to be picked up, and
   wherein the plurality of rectangular patterns are formed smaller than the wafer alignment mark and comprise different dimensions from each other.

2. The wafer alignment mark for image processing according to claim 1, wherein the wafer alignment mark is disposed in a scribe region provided in the peripheral edge of the one shot.

3. The wafer alignment mark for image processing according to claim 1, wherein the wafer alignment mark is disposed at least in one axial direction out of two axial directions crossing each other at right angles in the one shot.

4. The wafer alignment mark for image processing according to claim 1, wherein the rectangular patterns comprise frame-type patterns comprising a plurality of lines in a frame form.

5. The wafer alignment mark for image processing according to claim 4, wherein the plurality of lines comprise varied widths and the frame-type patterns comprise similar shapes.

6. The wafer alignment mark for image processing according to claim 4, wherein the rectangular patterns comprise varied ratios of line width to line length and the frame-type patterns comprise similar shapes.

7. The wafer alignment mark for image processing according to claim 4, wherein:
   the rectangular patterns comprise frame-type patterns with different line length ratios; and
   the rectangular patterns are disposed in the one shot by varying facing directions of the frame-type patterns.

8. The wafer alignment mark for image processing according to claim 1, wherein the rectangular patterns comprise box-type patterns having rectangular external shapes.

9. The wafer alignment mark for image processing according to claim 8, wherein the rectangular patterns comprise varied lengths of sides which form the external shapes of the box-type patterns and comprise similar shapes.

10. The wafer alignment mark for image processing according to claim 1, wherein the rectangular patterns are arranged in accordance with an order of a ratio of change in dimensions of the rectangular patterns.

11. The wafer alignment mark for image processing according to claim 1, wherein the rectangular patterns are arranged at random regardless of a ratio of change in dimensions of the rectangular patterns.

12. The wafer alignment mark for image processing according to claim 1, wherein each of said plurality of rectangular patterns comprises individual dimensions that are different from dimensions of other rectangular patterns.

13. The wafer alignment mark for image processing according to claim 1, wherein each of said plurality of rectangular patterns comprises four sides, each side having a length,
   wherein the length of each side is between 1 $\mu$m and 3 $\mu$m.

14. The wafer alignment mark for image processing according to claim 1, wherein each of said plurality of rectangular patterns comprises four sides, each side having a width,
   wherein the widths of each side of each rectangular pattern are different from the widths of each side of the other rectangular patterns.

15. A semiconductor device wafer comprising:
   a plurality of shots disposed along a surface of the wafer;
   at least one wafer alignment mark disposed along a peripheral edge of a shot in said plurality of shots; and
   a plurality of rectangular patterns provided in the at least one wafer alignment mark,
   wherein the plurality of rectangular patterns are formed smaller than the wafer alignment mark and comprise different dimensions from each other.

16. The semiconductor device according to claim 15, wherein the at least one wafer alignment mark is disposed in at least one axial direction out of two axial directions crossing each other at right angles in each of said plurality of shots.

17. The semiconductor device according to claim 15, wherein the at least one wafer alignment mark comprises a plurality of wafer alignment marks.

18. The semiconductor device according to claim 17, wherein the plurality of wafer alignment marks are disposed in each of two axial directions crossing each other at right angles in each of said plurality of shots.

19. The semiconductor device according to claim 15, wherein the at least one wafer alignment mark is disposed in a scribe region provided in the peripheral edge of each of said plurality of shots.

* * * * *